United States Patent [19]

Schiff

[11] 4,001,779
[45] Jan. 4, 1977

[54] DIGITAL ERROR CORRECTING DECODER

[75] Inventor: Maurice Leon Schiff, Fort Wayne, Ind.

[73] Assignee: International Telephone and Telegraph Corporation, Nutley, N.J.

[22] Filed: Aug. 12, 1975

[21] Appl. No.: 603,994

[52] U.S. Cl. .............. 340/146.1 AV; 340/146.1 AL
[51] Int. Cl.² ........................................ G06F 11/12
[58] Field of Search ....... 340/146.1 AL, 146.1 AV, 340/146.2; 235/181

[56] References Cited
UNITED STATES PATENTS

| | | | |
|---|---|---|---|
| 3,237,160 | 2/1966 | Mitchell | 340/146.1 AL |
| 3,245,033 | 4/1966 | Plouffe et al. | 340/146.1 AL |
| 3,531,798 | 9/1970 | Bureau | 340/146.1 AL |
| 3,541,314 | 11/1970 | Webb | 235/181 |
| 3,559,166 | 1/1971 | Schmidt | 235/181 |
| 3,560,925 | 2/1971 | Ohnsorge | 340/146.1 AL |
| 3,694,757 | 9/1972 | Hanna | 340/146.1 AL |
| 3,796,868 | 3/1974 | Kaul et al. | 340/146.2 |
| 3,818,442 | 6/1974 | Solomon | 340/146.1 AL |
| 3,836,908 | 9/1974 | Hegendorfer | 340/146.2 |
| 3,866,170 | 2/1975 | Verzocchi | 340/146.1 AL |

Primary Examiner—Charles E. Atkinson
Attorney, Agent, or Firm—John T. O'Halloran; Alfred C. Hill

[57] ABSTRACT

Received N pseudo random code words and one all logic "0" coded word are stored in a register one code word at a time. An N stage shift register and logic circuitry coupled to each stage of the shift register generate reference N pseudo random code words and one all logic "0" coded word with the bits of all the generated coded words being compared in an EXCLUSIVE OR gate with corresponding bits of a received coded word. The result of the comparison is coupled in common to a largest amplitude value detector which produces a strobe pulse when the amplitude value or the result of the comparison is greater than a preceding largest amplitude value detected and stored. An N stage holding shift register has each stage coupled to the output of the logic circuitry. The strobe pulse clocks the holding register to transfer the generated code word that resulted in the production of the strobe pulse to the holding register. The contents of the holding register are up-dated each time a strobe pulse is generated during a decoding cycle. At the end of the decoding cycle, the contents of the shift register are serially read out as an error free corrected code word for that one of the received code words which produced the largest amplitude value during the decoding cycle.

18 Claims, 4 Drawing Figures

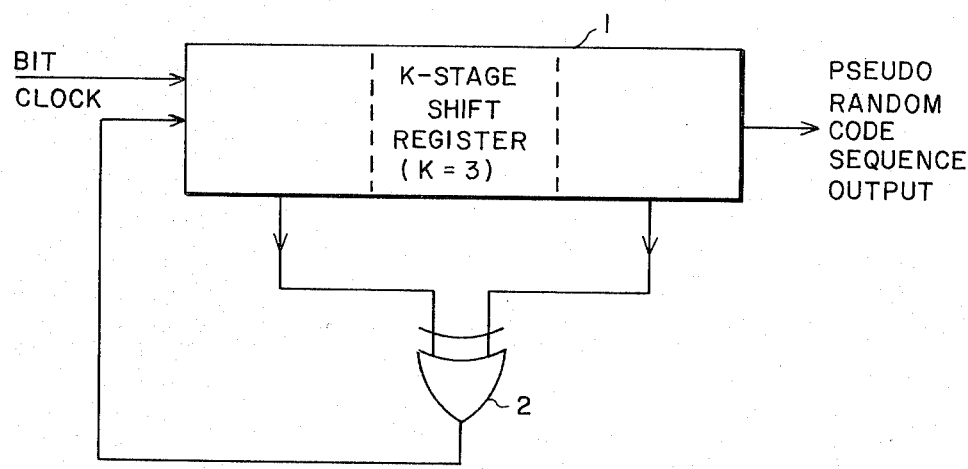
Fig. 1
Fig. 3
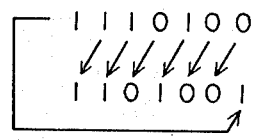
Fig. 2
| MESSAGE | PSEUDO RANDOM CODE SEQUENCE |
|---|---|
| 1 1 1 | 1 1 1 0 1 0 0 |
| 1 1 0 | 1 1 0 1 0 0 1 |
| 1 0 1 | 1 0 1 0 0 1 1 |
| 1 0 0 | 1 0 0 1 1 1 0 |
| 0 1 1 | 0 1 1 1 0 1 0 |
| 0 1 0 | 0 1 0 0 1 1 1 |
| 0 0 1 | 0 0 1 1 1 0 1 |
| 0 0 0 | 0 0 0 0 0 0 0 |

DIGITAL ERROR CORRECTING DECODER

BACKGROUND OF THE INVENTION

This invention relates to digital decoders and more particularly to a digital error correcting decoder.

Error correcting codes play an important role in modern day communications. The technical literature is filled with articles on the theory and practical implementation of such codes.

In communication theory, the optimum decoder is one where the received waveform (message) is correlated with each of the possible messages of the set of messages. The correlation having the maximum value is chosen as the message. To implement such an optimum decoder, the received signal can be processed in parallel with $M = 2^K$ correlators, where K is equal to the number of code bits, or in series with one correlator. The first method has the disadvantage in the large number of components reqired, which increase exponentially with increasing K. The second method requires only one correlator, but the processing speed is increased exponentially with increasing K. Neither solution is practical for K greater than three or four. Consequently, a great deal of effort has been devoted to developing practical decoders with a minimum loss in theoretical performance.

SUMMARY OF THE INVENTION

An object of the present invention is to provide a unique implementation of an error correction decoder for a class of cyclic codes known as pseudo random codes.

Another object of the present invention is to provide a unique implementation of an error correcting decoder for a class of cyclic codes known as pseudo random codes which is simple and efficient without any sacrifice in the performance of the error correcting codes.

A feature of the present invention is the provision of a digital error correcting decoder comprising: an input for received digital data including a random sequence of (N + 1) code words having N pseudo random code words and one all logic "0" code word, each of said (N + 1) code words having N bits, where N is an integer greater than one; first means to generate in a predetermined sequence each of the (N + 1) code words; and second means coupled to the input and the first means to compare each bit of each of the received (N + 1) code words with each bit of all of the generated (N + 1) code words in the predetermined sequence, to detect the largest amplitude value resulting from the comparison of each bit of one of the received (N + 1) code words with each bit of all of the generated (N + 1) code words and to select that one of the generated (N + 1) code words causing the detection of the largest amplitude value as an error corrected code word for the one of the received (N + 1) code words.

BRIEF DESCRIPTION OF THE DRAWING

Above-mentioned and other features and objects of this invention will become more apparent by reference to the following description taken in conjunction with the accompanying drawing, in which:

FIG. 1 is a block diagram of a pseudo random code sequence encoder;

FIG. 2 is a table illustrating the relationship between the bits in the shift register of FIG. 1 and the resulting pseudo random code sequence;

FIG. 3 is an illustration of the cyclic nature of pseudo random code sequences.

DESCRIPTION OF THE PREFERRED EMBODIMENT

Figure 4:
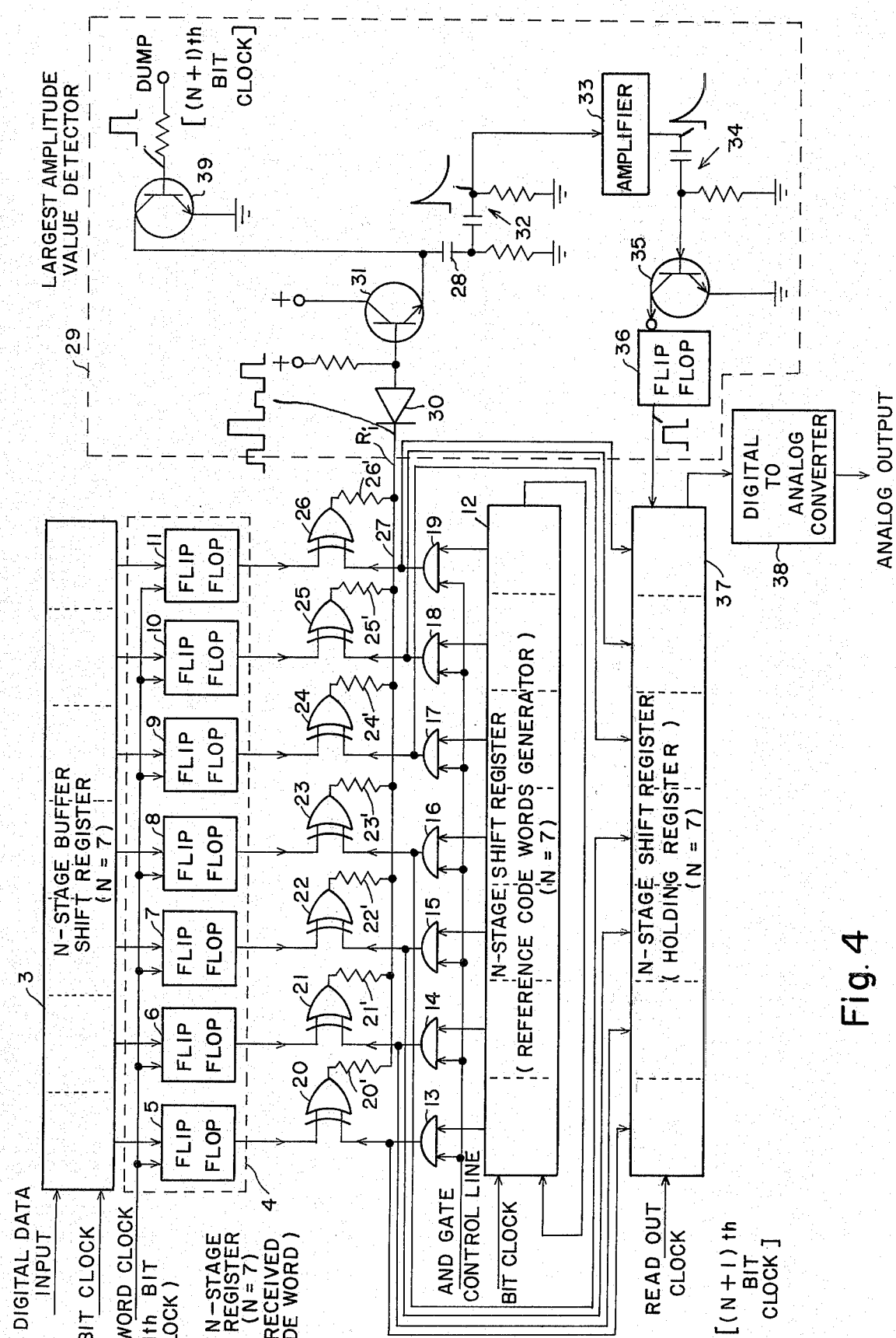
FIG. 4 is a block and schematic diagram of a digital error correcting decoder in accordance with the principles of the present invention.

Referring to FIG. 1, there is illustrated therein an encoder to produce pseudo random coded sequences including a K-stage shift register 1, where K = 3 in the illustration. The output signal of the first and last stage of shift register 1 are coupled to a conventional EXCLUSIVE OR gate 2 and the output signal of gate 2 is coupled to the input of the first stage of register 1. This configuration is the basis for generating a 7-bit pseudo random code sequence.

In more general terms, the implementation of FIG. 1 can be used as the encoder for a sub-class of correcting codes known as pseudo random codes. Depending on the initial contents (message) of the stages of register 1, seven clockings of register 1 by the bit clock will produce a unique 7-bit binary code or pseudo random code as illustrated in FIG. 2. It is thus seen that the implementation of the pseudo random code sequence encoder is exceptionally simple, as is usually the case. Usually, the difficulty lies in the decoder to which the present invention is directed.

An interesting and useful property of the pseudo random codes just described is their well known cyclic nature. For example, consider the two code words 1110100 and 1101001 illustrated in FIG. 2 and their cyclic relationship as illustrated in FIG. 3.

It can be seen that any similar cyclic shift of a code word is again a code word. Cyclic codes form an important sub-class of error correcting codes. Although the illustration given here is for a three stage device, the concept is generally extendable to a K-stage shift register whose output is suitably combined and fed back so as to produce a code length of $N = (2^K - 1)$ bits.

The concept of the decoder disclosed herein is based on the use of a digital correlator. FIG. 4 illustrates the block and schematic diagram of the decoder of the present application as applied to the $K = 3, N = 7$ case. The received digital data, denoted by $a_1, a_2, a_3 \ldots a_7$ which are either a logic level "1" or a logic level "0", is clocked into N-stage buffer shift register 3 by the bit clock. The contents of each stage of register 3 is clocked into an N-stage register 4 by a word clock which is produced at the end of the Nth bit clock. Register 4 includes seven flip flops 5–11 in a conventional manner and, thus, will contain the bits of one of the received pseudo random code words. At the start of the decoding process, N=stage shift register 12 is loaded with any one of the possible pseudo random code words of FIG. 2, denoted by $b_1, b_2, b_3 \ldots b_7$. The code word containing all "0"'s is not considered to be a pseudo random code word. The last stage of register 12 has its output coupled to the input of the first stage of register 12 to enable the generation in a predetermined sequence of the pseudo random code sequences as illustrated in FIG. 2. The output of each stage of register 12 is coupled to a logic circuit illustrated to be AND gates 13–19. It should be noted, however, that the logic circuit may take other forms, such as a NAND gate whose output is coupled to a NOT gate. The outputs of the AND gates 13-19 and the outputs of flip flops 5-11 are coupled to EXCLUSIVE OR gates 20-26, respectively. With the control line of AND gates 13-19 set at logic level "1" the output of each of gates 20-26 will be $$C_j = a_j \otimes b_j.$$

If $C_j$ is logic level "1", a voltage will be developed across the associated one of resistors 20' - 26'. On the other hand, if $C_j$ is logic level "0," no voltage will be developed across the associated one of resistors 20' - 26'. The voltage across resistors 20' - 26' resulting from output $C_j$ from each of the gates 20 - 26 is combined on a bus 27 to give a resultant amplitude value $$R_i = \Sigma\, C_j = \Sigma\, a_j \otimes b_j$$

It will be noted that $R_i$ is simply the correlation of the two codes $a$ and $b$. The value of $R_i$ is stored on capacitor 28 of the largest amplitude value detector 29. The value of $R_i$ is passed through diode 30 to activate transistor 31 and, thus, cause the amplitude value of $R_i$ to be stored on capacitor 28. The decoder now proceeds in a step by step manner as follows. The register 12 is clocked by the bit clock once to the right with the last bit being recirculated back to the first stage of register 12. Because of the cyclic nature of the pseudo random codes shown in FIG. 2, register 12 now contains another code word. Consequently, the quantity $R_i$ is again calculated and compared with the existing value on capacitor 28. If the new value of $R_i$ is less than the stored value, the decoder continues on by shifting the bits again. If the new value of $R_i$ is larger than the stored value, the new value is now stored and the decoding process proceeds. This operation is possible since when the new value of $R_i$ is less than the stored value, transistor 31 is biased to be non-conductive and the stored value will remain. However, when the new $R_i$ is larger than the present value stored on capacitor 28, transistor 31 will conduct and cause the new value of $R_i$ to be stored on capacitor 28. Each time the present value of $R_i$ is greater than the amplitude value stored on capacitor 28 a pulse will be passed through coupling network 32, amplifier 33 and coupling network 34 to trigger transistor 35 into conduction. The conduction of transistor 35 will activate flip flop 36 to form a strobe pulse which is applied to the N stage holding shift register 37. Each time a strobe pulse is produced, the code word at the output of AND gates 13-19 causing the production of the strobe pulse will be transferred to the corresponding stages of register 37. This procedure is repeated $2^{(K-1)}$ times after which register 12 is back to the starting position.

The remaining step is to correlate the received code word with the all "0" code word which is obviously not part of the cyclic ring. It is here that the importance of inserting AND gates 13-19 becomes clear. When the AND gate control line is a "1," the contents of the register 12 are passed to gates 20 - 26 without being impeded. However, when the AND gate control line is a "0," the input to gates 20 - 26 will be "0" regardless of the contents of register 12 and without affecting the contents of register 12 whatsoever.

Consequently, the decoding cycle for a single received code word which may have errors therein is finished by changing the AND gate control line to a "0" and as before, calculate $R_i$ and compare the calculated value of $R_i$ with the current value stored on capacitor 28. The contents of register 37 at the end of the decoding cycle should be the error free code word for which the largest amplitude value was detected. The code word stored in register 37 is error free since it was derived from register 12 and AND gates 13-19 and, thus, not subject to errors, such as caused by noise during transmisson from the transmitter to the receiver as might occur in the received code word. At the end of the decoded cycle a read out clock, which is the (N + 1) th bit clock, reads out the coded word in register 37 for coupling to the digital to analog converter 38. Converter 38 may directly produce an analog output from the pseudo random code sequence applied to its input or it may include a code translator to convert the pseudo random code sequence at the output of register 37 to the corresponding message code word illustrated in FIG. 2 and then produce an analog output from the message code word.

At the same time that register 37 is being read out, a dump pulse is applied to transistor 39 to cause conduction thereof so that capacitor 28 will be fully discharged to enable processing of the next received code word.

While the decoding cycle described hereinabove has been in process, the next code word to be decoded will be shifted to buffer register 3. When the next code word is to be decoded or correlated with the reference psuedo random code generated in register 12 and the all "0" code words provided by AND gates 13-19, the AND gate control line is reverted to "1" and the decoder is ready to process the next code word as described hereinabove.

The advantage of the decoder of the present invention is two fold. First, it can be seen from FIG. 4 that only one processor is required to decode all eight possible messages, i.e., serial processing is being performed. However, the unique code structure allows the decoding process to proceed from one step in the decoding process to the next with a simple cyclic shift of register 12. This shifting is performed at the encoded bit rate and is not increased over this rate as is usually the case for serial processing. The second advantage is the use of AND gates 13 - 19. The AND gate control line enables the generation of the special code of all "0"'s without requiring a separate device and without complicated additional shifting of register 12.

While I have described above the principles of my invention in conneton with specific apparatus it is to be clearly understood that this description is made only by way of example and not as a limitation to the scope of my invention as set forth in the objects thereof and in the accompanying claims.

I claim:

1. A digital error correcting decoder comprising:
   an input conductor for received digital data including a random sequence of (N + 1) code words having N pseudo random code words and one all logic "0" code word, each of said (N + 1) code words having N bits, where N is an integer greater than one;
   first means to generate in a predetermined sequence each of said (N + 1) code words;
   second means coupled to said input conductor and said first means to compare each bit of each of said received (N + 1) code words with each bit of all of said generated (N + 1) code words in said predetermined sequence;

third means coupled to said second means to detect the largest amplitude value resulting from said comparison of each bit of one of said receiver (N + 1) code words with each bit of all of said generated (N + 1) code words; and fourth means coupled to said first means and said third means to select that one of said generated (N + 1) code words causing the detection of the largest amplitude value as an error corrected code word for said one of said received (N + 1) code words.

2. A decoder according to claim 1, wherein said first means includes
a first N-stage shift register having an output of the last stage of said first shift register coupled to an input of the first stage of said first shift register to generate said N pseudo random code words in said predetermined sequence, and
N logic circuits each having an output, a control input and a second input, said second input of each of said logic circuits being coupled to an output of a different one of the stages of said first shift register, said logic circuits passing to their outputs each of said N pseudo random code words in said predetermined sequence when each of said control inputs are at one logic level and to pass to their outputs said all logic "0" code word when each of said control inputs are at the other logic level.

3. A decoder according to claim 2, wherein each of said N logic circuits includes
an AND gate, said AND gates having their control inputs at logic level "1" to pass each of said N pseudo random code words in said predetermined sequence and at logic level "0" to pass said all logic "0" code word.

4. A decoder according to claim 3, wherein said second means includes
a second N-stage shift register coupled to said input connector,
an N-stage register, each stage of said register being coupled to a different stage of said second shift register, and
N digital comparators each coupled to a different one of the stages of said register and a different one of said AND gates.

5. A decoder according to claim 4, wherein each of said comparators includes
an EXCLUSIVE OR gate.

6. A decoder according to claim 2, wherein said second means includes
a second N-stage shift register coupled to said input conductor,
an N-stage register, each stage of said register being coupled to a different stage of said second shift register, and
N digital comparators each coupled to a different one of the stages of said register and a different one of said logic circuits.

7. A decoder according to claim 6, wherein each of said comparators include
an EXCLUSIVE OR gate.

8. A decoder according to claim 1, wherein said second means includes
a first N-stage shift register coupled to said input conductor,
an N-stage register, each stage of said register being coupled to a different stage of said first shift register, and N digital comparators each coupled to a different one of the stages of said register and said first means responsive to a different bit of each of said generated (N + 1) code words.

9. A decoder according to claim 8, wherein each of said comparators include
an EXCLUSIVE OR gate.

10. A decoder according to claim 4, wherein said third means includes
a largest amplitude value detector coupled in common to the outputs of each of said comparators to produce a strobe pulse whenever an amplitude value is detected that is larger than a preceding detected and stored larger amplitude value.

11. A decoder according to claim 10, wherein said fourth means includes
a third N-stage shift register having each of its stages coupled to the output of a different one of said AND gates and to said detector responsive to said strobe pulse to store that one of said generated (N + 1) code words associated with the production of said strobe pulse, said third shift register being read-out serially at the end of a decoding cycle to provide said error corrected code word.

12. A decoder according to claim 4, wherein said fourth means includes
a third N-stage shift register having each of its stages coupled to the output of a different one of said AND gates and to said third means responsive to an output signal of said third means indicating whenever said largest amplitude value is detected to store that one of said generated (N + 1) code words associated with the production of said output signal, said third shift register being read-out serially at the end of a decoding cycle to provide said error corrected code word.

13. A decoder according to claim 6, wherein said third means includes
a largest amplitude value detector coupled in common to the outputs of each of said comparators to produce a strobe pulse whenever an amplitude value is detected that is larger than a preceding detected and stored larger amplitude value.

14. A decoder according to claim 13, wherein said fourth means includes
a third N-stage shift register having each of its stages coupled to the output of a different one of said logic circuits and to said detector responsive to said strobe pulse to store that one of said generated (N + 1) code words associated with the production of said strobe pulse, said third shift register being read-out serially at the end of a decoding cycle to provide said error corrected code word.

15. A decoder according to claim 2, wherein said fourth means includes
a second N-stage shift register having each of its stages coupled to the output of a different one of said logic circuits and to said third means responsive to an output signal of said third means indicating whenever said largest amplitude value is detected to store that one of said generated (N + 1) code words associated with the production of said output signal, said third shift register being read-out serially at the end of a decoding cycle to provide said error corrected code word.

16. A decoder according to claim 8, wherein said third means includes
a largest amplitude value detector coupled in common to the outputs of said comparators to produce a strobe pulse whenever an amplitude value is detected that is larger than a preceding detected and stored larger amplitude value.

17. A decoder according to claim 16, wherein said fourth means includes
a second N-stage shift register having each of its stages coupled to said first means, each of its stages being responsive to a different bit of each of said generated $(N + 1)$ code words and coupled to said detector responsive to said strobe pulse to store that one of said generated $(N + 1)$ code words associated with the production of said strobe pulse, said second shift register being read-out serially at the end of a decoding cycle to provide said error corrected code word.

18. A decoder according to claim 1, wherein said fourth means includes
a first N-stage shift register having each of its stages coupled to said first means and to said third means responsive to an output signal of said third means indicating whenever said largest amplitude value is detected to store that one of said generated $(N + 1)$ code words associated with the production of said output signal, said third shift register being read-out serially at the end of a decoding cycle to provide said error corrected code word.

* * * * *